US009157665B2

(12) United States Patent
Erickson

(10) Patent No.: US 9,157,665 B2
(45) Date of Patent: Oct. 13, 2015

(54) UNITIZED PHOTOVOLTAIC ASSEMBLY

(76) Inventor: Richard William Erickson, Pomona, CA (US)

( * ) Notice: Subject to any disclaimer, the term of this patent is extended or adjusted under 35 U.S.C. 154(b) by 0 days.

(21) Appl. No.: 13/065,104

(22) Filed: Mar. 15, 2011

(65) Prior Publication Data

US 2012/0234377 A1 Sep. 20, 2012

(51) Int. Cl.
| | |
|---|---|
| F24J 2/52 | (2006.01) |
| H01L 31/05 | (2014.01) |
| F24J 2/46 | (2006.01) |
| H02S 40/32 | (2014.01) |
| H02S 20/23 | (2014.01) |
| H02S 40/10 | (2014.01) |
| H02S 40/36 | (2014.01) |

(52) U.S. Cl.
CPC ............. *F24J 2/5254* (2013.01); *F24J 2/461* (2013.01); *F24J 2/5205* (2013.01); *F24J 2/526* (2013.01); *F24J 2/5245* (2013.01); *H01L 31/05* (2013.01); *H02S 20/23* (2014.12); *H02S 40/10* (2014.12); *H02S 40/32* (2014.12); *H02S 40/36* (2014.12); *F24J 2002/5218* (2013.01); *F24J 2002/5284* (2013.01); *Y02B 10/12* (2013.01); *Y02B 10/20* (2013.01); *Y02E 10/47* (2013.01); *Y02E 10/50* (2013.01); *Y10T 29/49117* (2015.01); *Y10T 29/49826* (2015.01)

(58) Field of Classification Search
CPC .... Y02B 10/12; Y02E 10/47; H01L 31/0422; F24J 2/5254; F24J 2/526; F24J 2/5245
USPC ............. 52/173.3; 136/251; 65/173.3
See application file for complete search history.

(56) References Cited

U.S. PATENT DOCUMENTS

| | | | |
|---|---|---|---|
| 4,150,660 A | | 4/1979 | Peters et al. |
| 4,154,223 A | | 5/1979 | Lof |
| 4,372,292 A | | 2/1983 | Ort |
| 4,429,872 A | * | 2/1984 | Capachi ................ 473/490 |
| 4,636,577 A | | 1/1987 | Peterpaul |
| 4,936,063 A | | 6/1990 | Humphrey |
| 5,338,369 A | | 8/1994 | Rawlings |
| 5,409,549 A | | 4/1995 | Mori |
| 5,497,587 A | | 3/1996 | Hirai et al. |
| 5,524,401 A | | 6/1996 | Ishikawa et al. |
| 5,706,617 A | | 1/1998 | Hirai et al. |
| 5,740,996 A | | 4/1998 | Genschorek |
| 5,787,653 A | | 8/1998 | Sakai et al. |
| 5,986,203 A | | 11/1999 | Hanoka et al. |
| 6,105,317 A | | 8/2000 | Tomiuchi et al. |
| 6,201,179 B1 | | 3/2001 | Dalacu |

(Continued)

*Primary Examiner* — Andrew J Triggs
(74) *Attorney, Agent, or Firm* — Klein, O'Neill & Singh, LLP

(57) ABSTRACT

A unitized photovoltaic assembly is disclosed. A unitized photovoltaic assembly consists of a unitary frame designed to retain a plurality of photovoltaic modules. The unitary frame is formed by orienting a plurality of rails in the lateral direction above and mounted to a plurality of struts oriented in the vertical direction. Once the unitary framed is formed, photovoltaic modules slide into slots running the length of the rails and are thus retained in the unitary frame. Also added to the unitary frame are a series of power conversion elements, retaining brackets, mounting brackets, and cleaning elements. The completed unitized photovoltaic assembly can be fabricated off-site, transported as a single unit and installed to a roof or other surface with the use of a specialized lifting frame, also disclosed. Additional unitized photovoltaic assemblies can be mechanically and electrically interconnected to form a complete photovoltaic system.

30 Claims, 11 Drawing Sheets

(56) References Cited

U.S. PATENT DOCUMENTS

| | | | |
|---|---|---|---|
| 6,201,180 B1 * | 3/2001 | Meyer et al. | 136/244 |
| 6,323,478 B1 | 11/2001 | Fujisaki et al. | |
| 6,360,491 B1 | 3/2002 | Ullman | |
| 6,414,237 B1 | 7/2002 | Boer | |
| 6,521,821 B2 | 2/2003 | Makita et al. | |
| 6,670,541 B2 * | 12/2003 | Nagao et al. | 136/251 |
| 6,672,018 B2 | 1/2004 | Shingleton | |
| 6,784,360 B2 | 8/2004 | Nakajima et al. | |
| 6,959,517 B2 | 11/2005 | Poddany et al. | |
| 7,012,188 B2 | 3/2006 | Erling | |
| 7,043,884 B2 | 5/2006 | Moreno | |
| 7,260,918 B2 | 8/2007 | Liebendorfer | |
| 7,406,800 B2 * | 8/2008 | Cinnamon et al. | 52/173.3 |
| 7,487,771 B1 | 2/2009 | Eiffert et al. | |
| 7,592,537 B1 | 9/2009 | West | |
| 7,600,349 B2 * | 10/2009 | Liebendorfer | 52/173.3 |
| 7,721,492 B2 | 5/2010 | Plaisted et al. | |
| 7,745,722 B2 | 6/2010 | Warfield et al. | |
| 7,748,175 B2 | 7/2010 | Liebendorfer | |
| 7,766,292 B2 | 8/2010 | Liebendorfer | |
| 7,774,998 B2 | 8/2010 | Aschenbrenner | |
| 7,819,114 B2 * | 10/2010 | Augenbraun et al. | 126/623 |
| 7,832,157 B2 | 11/2010 | Cinnamon | |
| 7,832,176 B2 | 11/2010 | McCaskill et al. | |
| 7,847,185 B2 | 12/2010 | Schwarze | |
| 7,915,519 B2 * | 3/2011 | Kobayashi | 136/251 |
| 8,176,693 B2 * | 5/2012 | Abbott et al. | 52/173.3 |
| 8,256,169 B2 * | 9/2012 | Cusson et al. | 52/173.3 |
| 8,273,981 B2 * | 9/2012 | Kobayashi | 136/251 |
| 8,316,590 B2 * | 11/2012 | Cusson | 52/173.3 |
| 8,382,513 B2 * | 2/2013 | Kobayashi | 439/507 |
| 8,404,963 B2 * | 3/2013 | Kobayashi | 136/244 |
| 8,461,449 B2 * | 6/2013 | Kobayashi | 136/251 |
| 2003/0094193 A1 | 5/2003 | Mapes et al. | |
| 2004/0163338 A1 | 8/2004 | Liebendorfer | |
| 2006/0086382 A1 | 4/2006 | Plaisted | |
| 2006/0118163 A1 | 6/2006 | Plaisted et al. | |
| 2006/0225780 A1 | 10/2006 | Johnson, III et al. | |
| 2006/0260670 A1 | 11/2006 | Terunuma et al. | |
| 2007/0079861 A1 | 4/2007 | Morali | |
| 2007/0079865 A1 | 4/2007 | Warfield et al. | |
| 2007/0251567 A1 | 11/2007 | Plaisted | |
| 2008/0053517 A1 * | 3/2008 | Plaisted et al. | 136/251 |
| 2008/0087320 A1 | 4/2008 | Mapes et al. | |
| 2009/0014058 A1 | 1/2009 | Croft et al. | |
| 2009/0019796 A1 * | 1/2009 | Liebendorfer | 52/173.3 |
| 2009/0078299 A1 | 3/2009 | Cinnamon et al. | |
| 2009/0114271 A1 * | 5/2009 | Stancel | 136/251 |
| 2009/0230265 A1 * | 9/2009 | Newman et al. | 248/229.11 |
| 2010/0018571 A1 | 1/2010 | Placer | |
| 2010/0065108 A1 * | 3/2010 | West et al. | |
| 2010/0147362 A1 | 6/2010 | King et al. | |
| 2010/0237028 A1 * | 9/2010 | Cusson | 211/41.1 |
| 2010/0263297 A1 * | 10/2010 | Liebendorfer | 52/11 |
| 2010/0288336 A1 | 11/2010 | Kitano et al. | |
| 2010/0294340 A1 | 11/2010 | Cunningham et al. | |
| 2011/0070765 A1 * | 3/2011 | Kobayashi | 439/387 |
| 2011/0194886 A1 * | 8/2011 | Wu et al. | 403/23 |
| 2011/0203637 A1 * | 8/2011 | Patton et al. | 136/244 |
| 2011/0209745 A1 * | 9/2011 | Korman et al. | 136/251 |
| 2012/0017526 A1 * | 1/2012 | Eide | 52/173.3 |
| 2012/0027550 A1 * | 2/2012 | Bellacicco et al. | 414/547 |
| 2012/0167957 A1 * | 7/2012 | Verfuerth et al. | 136/251 |
| 2012/0234377 A1 * | 9/2012 | Erickson | 136/251 |
| 2012/0240485 A1 * | 9/2012 | Amarasinghe | 52/127.1 |

* cited by examiner

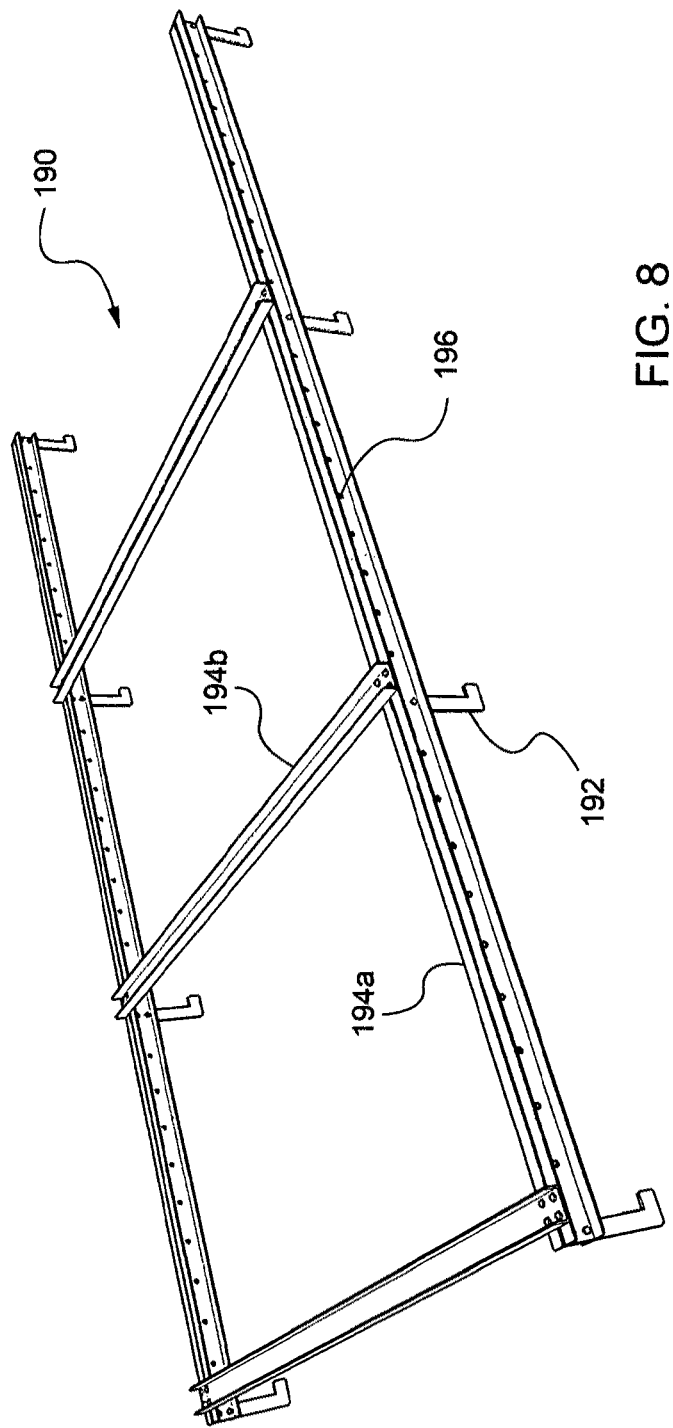

UNITIZED PHOTOVOLTAIC ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

1. Field of the Invention

The present invention is in the field of photovoltaic panels. More particularly, the present invention is in the technical field of photovoltaic panel mounting systems.

2. Description of the Related Art

Photovoltaic, or solar, systems have emerged as a popular source of alternative energy. However, numerous deficiencies exist in current mounting devices and methods of installation. Striking a balance between customizability and efficiency of installation is paramount to the design and implementation of a successful photovoltaic system.

While many available photovoltaic systems are highly customizable, they lack in efficiency. Current installation methods, commonly referred to as build-on-site, require multiple steps taking place over several days of construction. First, workers must attach mounting devices to the surface or underlying substructure. Each additional mounting device requires penetration of the roof surface with a lag bolt, which compromises the roof's weather resistant barrier. Measurements are then taken and framing members are cut to length and mounted. Next, workers must measure, cut and install large amounts of wiring and component connections. Finally, photovoltaic modules are added individually until a completed photovoltaic array is formed. Each photovoltaic module must also be secured to the framework by additional mounting hardware. In many methods, this requires the added steps of inserting, positioning and tightening several nuts, bolts and washers per panel. Furthermore, addition of an aftermarket panel cleaning system results in added labor costs and risks possible damage to the installed photovoltaic panels.

In addition, the on-site installation of electrical wiring and power conversion elements creates unsafe working conditions for installers. When conventional string inverters are used as part of the system, the photovoltaic panels must be electrically connected in series as they are installed resulting in live, high-voltage, DC current on the roof. The use of string inverters also requires that extreme measures be taken to insure that all elements of the framing system are securely grounded. The installers must work around this live power to install additional strings of panels and their associated components. The large array of tools and components that must be loaded onto the sloped roof surface and controlled during installation makes build-on-site construction a complex and hazardous process.

Once installed, photovoltaic arrays are subjected to varying climates and must be able to withstand high winds and snow accumulation. Current systems, such as the one described above, are entirely dependent on the underlying roof surface to maintain their form. Additional mounting points can marginally increase the stability and load capacity of these build-on-site systems, but require additional penetrations to the roof surface. One of the major disadvantages to build on-site construction is that framing members exist as independent components rather than as an integrated framework. During installation the framing members are secured directly to the mounting devices without the added benefit of stabilizing cross members. Each row of photovoltaic panels is therefore mechanically independent from the adjacent rows. Because of this, many roof surface mounting points are required and there is no system wide load sharing. The inability to create an integrated framework makes build-on-site systems inefficient for carrying high wind and snow loads.

The increased demand for solar systems brings with it a need for a safer and more efficient means of producing and deploying them. Therefore, a need exists in the industry for a new and useful integrated, multi-module, photovoltaic mounting system capable of off-site prefabrication, transportation and installation as a unitized assembly.

BRIEF SUMMARY OF THE INVENTION

The present disclosure is directed to an apparatus and method for fixing photovoltaic modules within a unitized photovoltaic assembly and installing on a roof or other surface. Central to the unitized photovoltaic assembly is a unitary frame support structure. The unitary frame is formed from horizontal rails and vertical struts positioned in uniform rows and columns respectively. The unitary frame is discussed herein in the context of being installed on a sloping residential roof. In this context, the term "horizontal" used in connection with the rails means that each rail extends laterally along the sloping roof without a substantial change in inclination along its length, and the term "vertical" used in connection with the struts means that each strut is inclined along its length so that one end of the strut is vertically higher than the other end. The rails are solidly affixed to the struts by welding or other means. Each rail is a uniform structure having a double "I" cross-section and receiving slots. Opposing edges of the photovoltaic panels are retained within these receiving slots. Retaining brackets and spacer clips are provided for maintaining the photovoltaic panels within the receiving slots. Unlike existing systems, the unitized photovoltaic assembly is not solely dependent on the support of the underlying surface to maintain its form. As a result, less mounting hardware is required to obtain a rigid structure, which reduces the number of roof surface penetrations and installation time. This has the added benefit of reducing damage to the roof surface caused by workers walking on it.

Installation is further streamlined with the inclusion of additional elements during the off-site fabrication process. Power conversion elements are affixed to the unitary frame and pre-wired to the photovoltaic panels. The wiring includes polarized connector elements at the terminal ends allowing adjacent unitized photovoltaic assemblies to be easily connected to one another. Also, a spray head is installed for cleaning the photovoltaic panels and tubing is connected for carrying cleaning fluids. By pre-assembling these systems, workers will no longer be subjected to hazardous conditions while maneuvering tools, materials and themselves around live wires on a sloped roof surface.

The unitized photovoltaic assembly is designed to integrate with adjacent assemblies to form a completed array. Various assembly configurations are possible including, but not limited to, 1×2, 1×3, 2×2 and 2×3 depending on the size and shape of the installation surface. Adjacent assemblies are structurally joined with mounting interlocks adding to the rigidity and load carrying capacity of the completed system. Mounting interlocks are attached to the end of a strut or rail and engage with corresponding mounting interlocks on adjacent assemblies. Electrical wiring and tubing are also connected between adjacent assemblies to complete the system.

In order to form a completed system, each unitized photovoltaic assembly is installed from above with the use of a specialized lifting frame. Since larger unitized photovoltaic assemblies are not sufficiently rigid to stand alone, the lifting frame provides additional support to prevent the assembly from flexing and causing damage to the photovoltaic panels. Use of the specialized lifting frame in conjunction with a crane alleviates the need for photovoltaic panels to be individually carried up a ladder to the roof surface. The lifting frame includes a plurality of tabs and in some instances a "U" channel, which engage and stabilize the horizontal rails of the unitary frame. Cables attached to the lifting frame are adjustable to match the slope of the roof surface. Once positioned, the unitized photovoltaic assembly is lowered onto the roof surface and secured to conventional mounting devices that have been pre-installed on the roof or other surface. The type of mounting devices will vary depending on the installation surface.

The foregoing is intended to provide a broad description of the present invention in order to demonstrate its contributions to the art and better understand the descriptions to follow. These and other features of the present invention will be readily apparent to persons of ordinary skill in the art upon reading the entirety of this disclosure.

BRIEF DESCRIPTION OF THE SEVERAL VIEWS OF THE DRAWING

FIG. 8 is a perspective view of lifting frame 190 according to the present disclosure.

DETAILED DESCRIPTION OF THE INVENTION

The present disclosure describes an apparatus for mounting photovoltaic modules, herein referred to as a unitized photovoltaic assembly 100. The preferred embodiment as shown in FIGS. 1 through 11, comprises a unitary frame 110 constructed to retain multiple photovoltaic modules 102 and various other elements. The unitized photovoltaic assembly 100 is designed for off-site fabrication, and can be transported and installed as a single unit, thereby reducing the time and resources required for build on-site construction.

Figure 1:
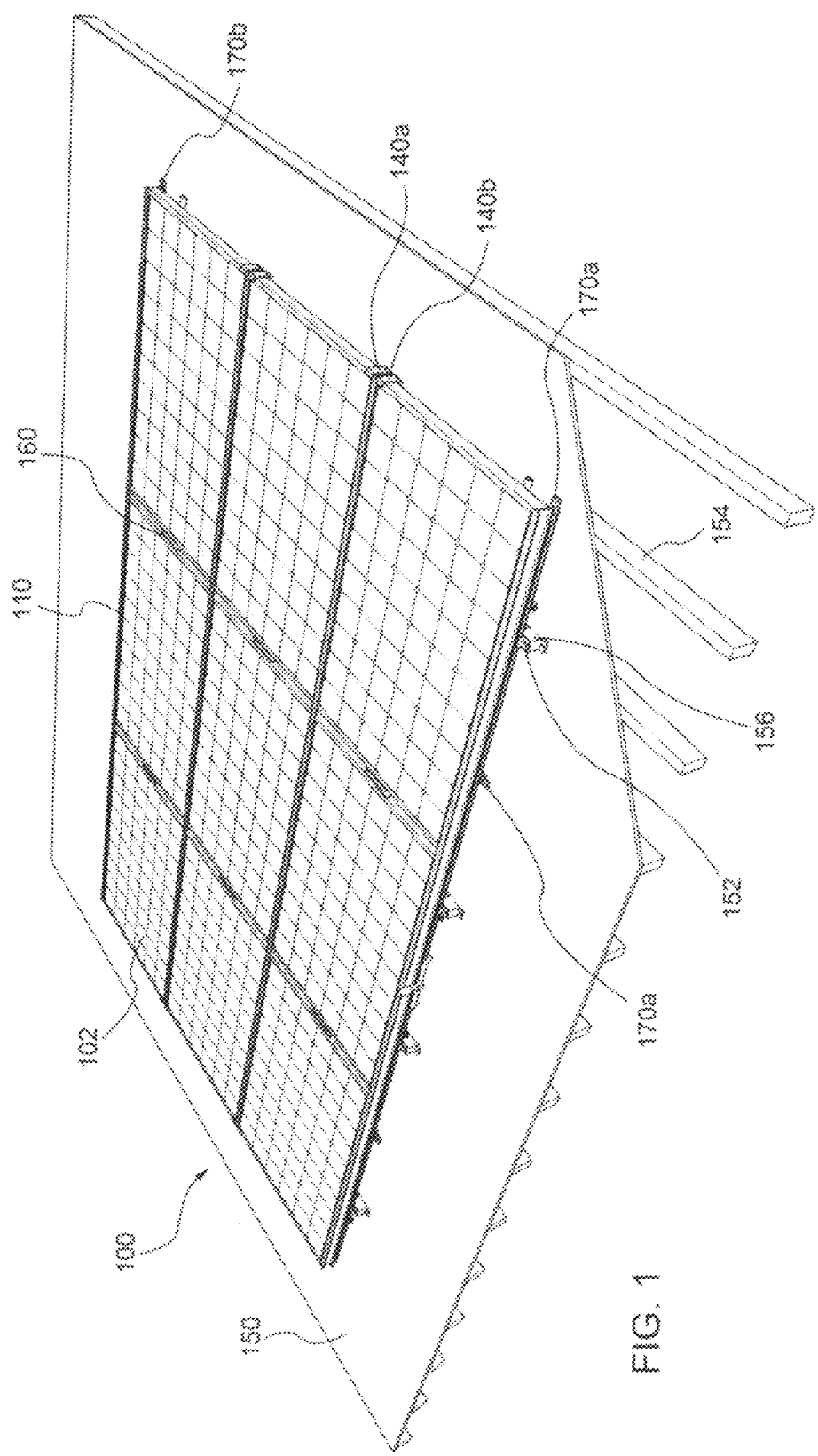
FIG. 1 is a perspective view of a unitized photovoltaic assembly 100 according to the present invention.

In the preferred embodiment of unitized photovoltaic assembly 100, shown in FIG. 1, a unitary frame 110 provides the structural framework for the mounting of various elements. As shown, nine photovoltaic modules 102 are arranged into three rows defined by unitary frame 110. Alternatively, unitary frame 110 can be adjusted to accommodate more or less photovoltaic modules 102, depending on the application requirements. The Photovoltaic modules 102 are maintained within unitary frame 110 by a plurality of retaining brackets 140a, b at the ends of each row in addition to spacers 160 between adjacent photovoltaic modules 102.

The unitized photovoltaic assembly 100 is secured to a surface 150 with repositionable mounting brackets 152. More specifically, mounting brackets 152 are attached to the unitary frame 110 and bolted to mounting devices 156. The mounting devices 156 are pre-installed to the surface 150 in accordance with local building codes. In the present embodiment, mounting devices 156 are bolted to rafters 154. Various types of mounting devices 156, common within the industry, may be utilized. In some instances, mounting devices 156 may not be necessary, in which case mounting brackets 152 can be secured directly to the surface 150.

Also shown in FIG. 1, are mounting interlocks 170a,b. Mounting interlocks 170a,b are secured to the unitary frame 110 and are used to mechanically interconnect adjacent unitized photovoltaic assemblies 100 to form a complete system. Because of mounting interlocks 170a, b, various arrangements of unitized photovoltaic assemblies 100 can be created, which have the added benefit of increased load sharing across the completed system.

Figure 2:
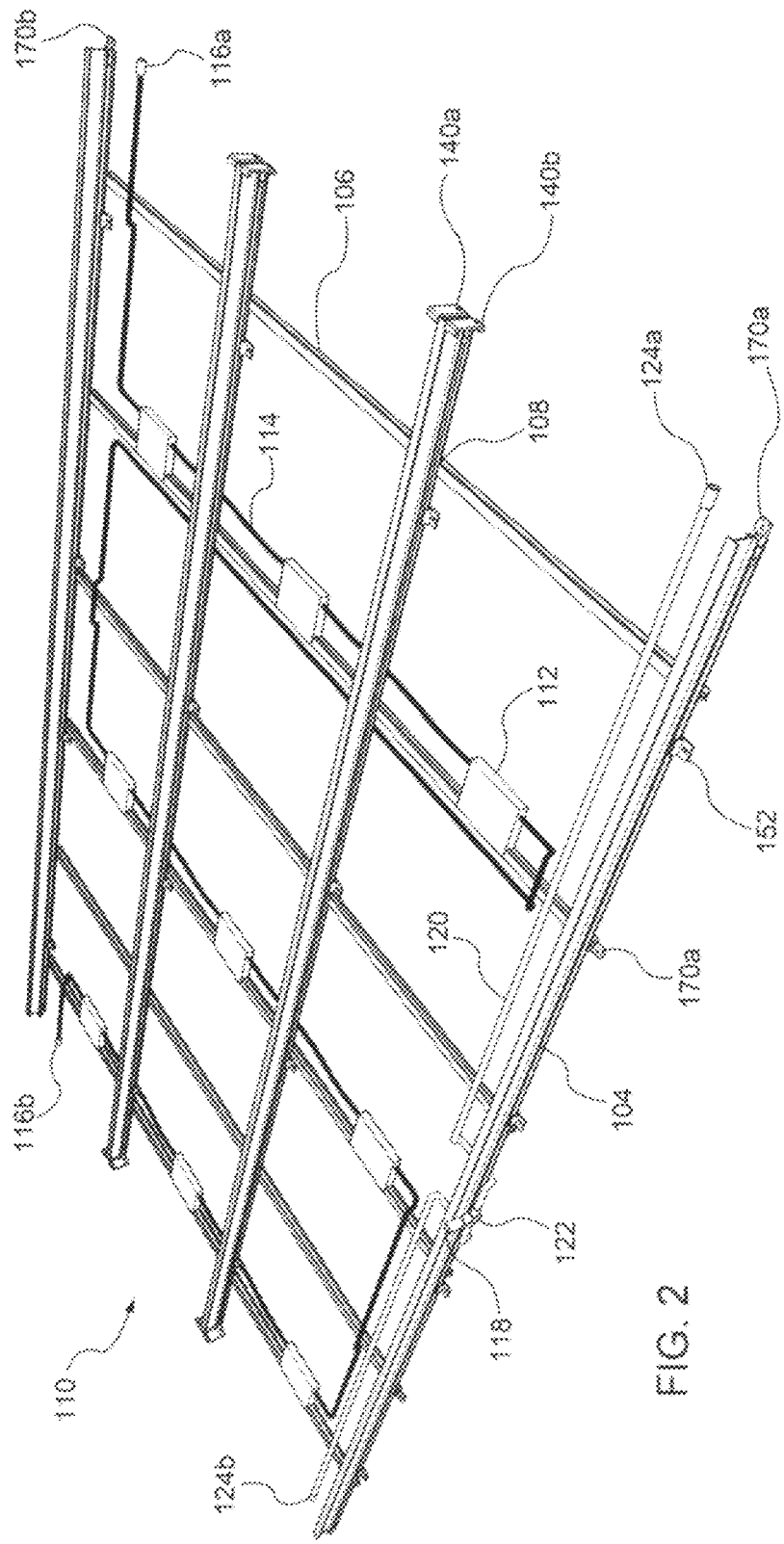
FIG. 2 is a perspective view of unitary frame 110 according to the present invention.

FIG. 2 shows unitary frame 110 in further detail, without photovoltaic modules 102. The unitary frame 110 is comprised of a plurality of rails 104 mounted above and welded to a plurality of struts 106 at cross points 108. Brackets or fasteners could also be used in place of welding to mount rails 104 to struts 106. Fabrication in this manner creates a unified framework central to the formation of the unitized photovoltaic assembly 100. In the preferred embodiment, additional elements are attached to unitary frame 110 prior to installation. Additional elements may include, but are not limited to, power conversion elements 112, spray head 118, wiring 114, tubing 120, retaining brackets 140a,b, mounting interlocks 170a,b and mounting brackets 152.

In the preferred embodiment, power conversion elements 112 are micro-inverters, which are attached to unitary frame 110 beneath photovoltaic modules 102. The micro-inverters convert power from unregulated direct current (DC) to alternating current (AC) or to regulated DC depending on the installation requirements. Each power conversion element 112 is electrically connected to a corresponding photovoltaic module 102. Individual power conversion elements 112 are also connected to one another by wiring 114. Wiring 114 is generally attached to unitary frame 110 and terminates at the perimeter of unitized photovoltaic assembly 100 with polarized power connectors 116a, b. Polarized power connector 116a can be connected to 116b of an adjacent unitized photovoltaic assembly 100 permitting a plurality of unitized photovoltaic assemblies 100 to aggregate their power by providing feed in and feed out paths for electrical power and control signals. The polarized power connectors 116a,b can also be connected to a power collection unit when unitized photovoltaic assembly 100 is an original or terminal assembly. In this manner, minimal effort is required to wire the completed system.

The preferred embodiment also includes at least one assembly spray head 118 attached to unitary frame 110. Spray head 118 directs cleaning fluids into a spray pattern covering photovoltaic modules 102. Spray head 118 is connected to tubing 120 by a "T" spray connector 122. In an alternate embodiment, when spray head 118 is the final sprayer, spray connector 122 is an elbow instead of a "T". Tubing 120 supplies alternately, clear and soapy water from a pressure source (not shown). Tubing 120 is also generally attached to the unitary frame 110 and terminates at the perimeter of unitized photovoltaic assembly 100 with fluid connectors 124a,b. Fluid connectors 124a,b allow cleaning fluid to flow to and from adjacent unitized photovoltaic assemblies 100.

The addition of elements to the unitary frame 110 in this manner provides for a plug-and-play unitized photovoltaic assembly 100. This system allows for additional unitized photovoltaic assemblies 100 to be added with minimal connections and little or no additional wiring or tubing. Also, pre-wiring and the use of low-voltage power conversion elements 112 eliminates hazardous live wiring on the roof surface 150 creating a safer working environment.

Figure 3:
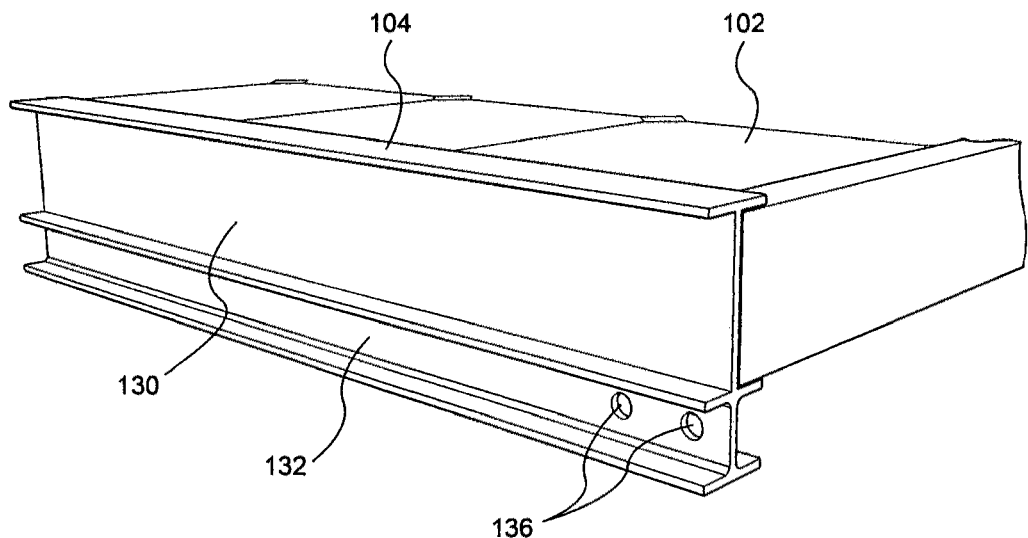
FIG. 3 is a perspective view of horizontal rails 104 according to the present invention.

As referred to above, the main structural components of unitary frame 110 are rails 104 and struts 106. FIG. 3 illustrates the uniform structural cross-section of rails 104. An extrusion process forms rails 104 with a uniform double "I" cross section designed to resist flexure. In the preferred embodiment, rails 104 are made from aluminum alloy, but other material having similar strength to weight properties could also be used. The structure of rails 104 provides U-shaped receiving slots 130 for retaining photovoltaic modules 102. In the preferred embodiment, rails 104 are oriented laterally and substantially parallel to one another. When arranged in this manner, photovoltaic modules 102 can be slideably retained by their opposing edges within slots 130. In the illustrated embodiment the slots 130 present smooth support surfaces upon which photovoltaic module edges can slide. The retained opposing edges of photovoltaic modules 102 can be either the long or short edges. Accordingly, the length and arrangement of rails 104 are determined by the dimensions, orientation and number of photovoltaic modules 102 to be retained. Additionally, rails 104 provide U-shaped receiving slots 132 for accepting mounting interlocks 170a,b and retaining brackets 140a,b. Rails 104 also include holes 136 for the securing of mounting interlocks 170a,b and retaining brackets 140a,b.

Figure 4A:
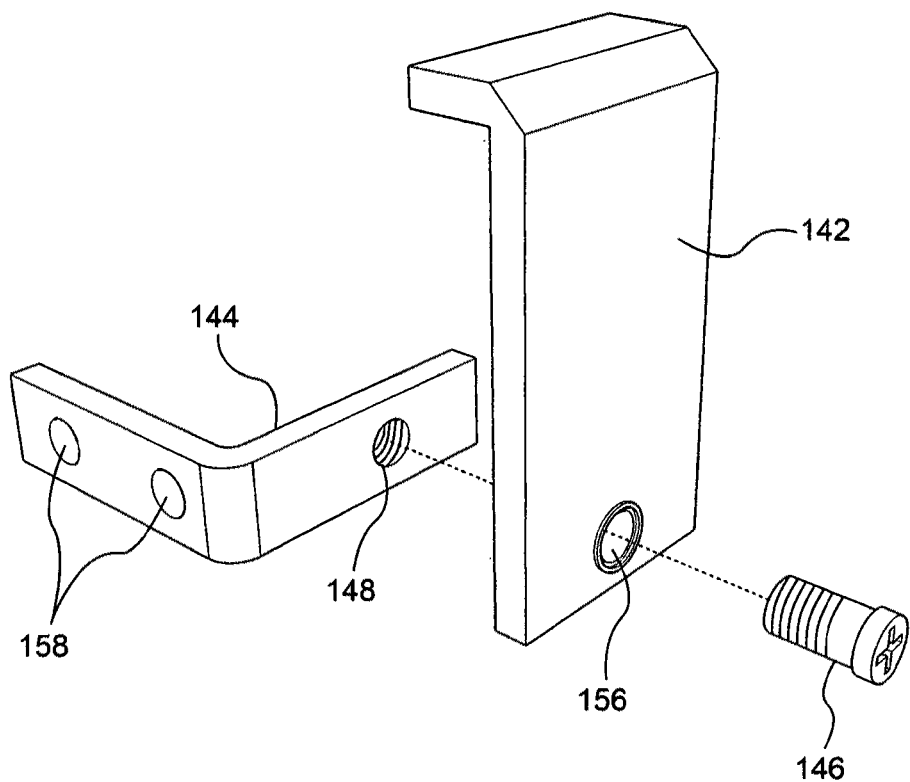
FIG. 4A is an exploded view of retaining bracket 140a according to the present invention.
Figure 4B:
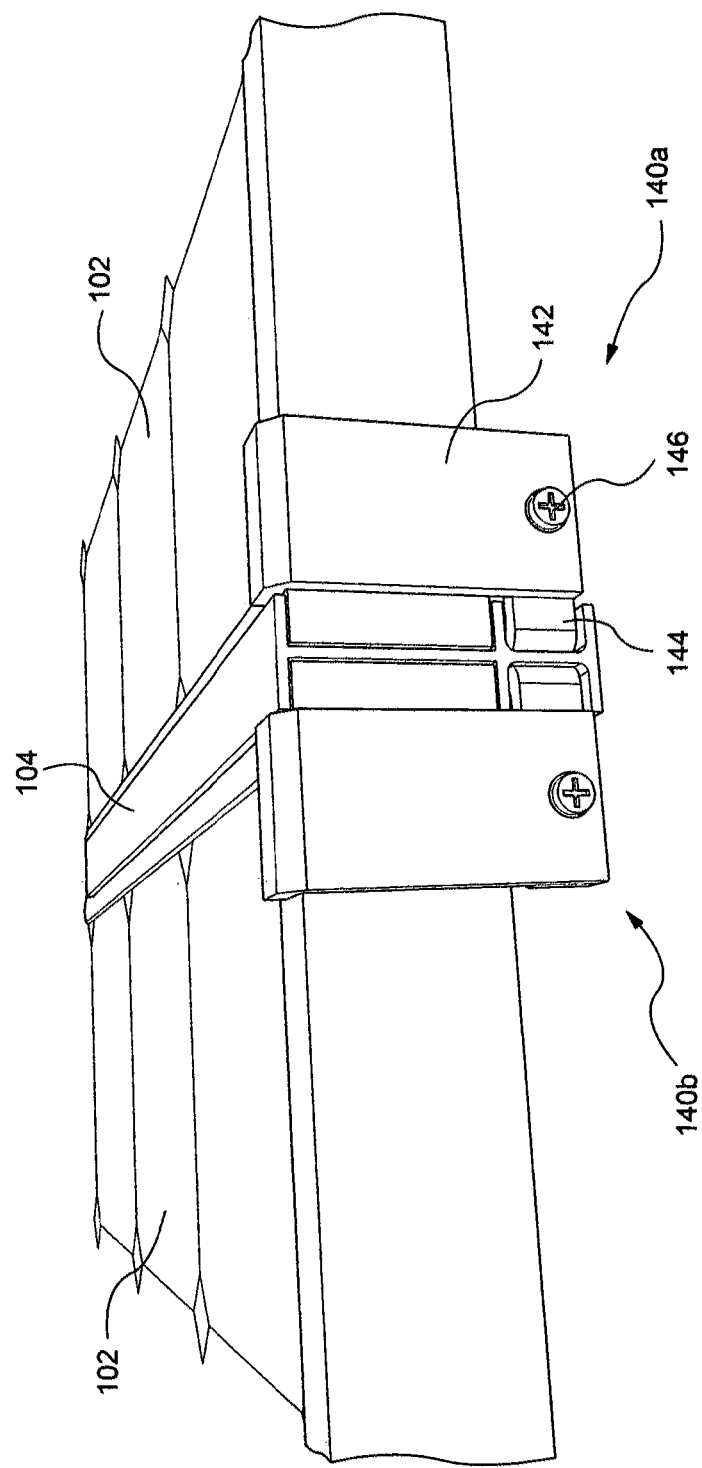
FIG. 4B is a perspective view of retaining brackets 140a, b according to the present invention.

FIGS. 4A and 4B more closely illustrate retaining brackets 140a,b, shown generally in FIG. 1. Retaining brackets 140a,b, laterally retain photovoltaic modules 102 within slots 130. In the present embodiment, individual retaining bracket assemblies 140a,b comprise a retaining element 142 that engages the outer edge of the end most photovoltaic modules 102 in each row so as to block the photovoltaic modules from sliding out of the unitary frame 110. Retaining element 144 is attached to an L bracket 144 by fastener 146. L bracket 144 includes a threaded hole 148 for receiving fastener 146. Removal of fastener 146 allows retaining element 142 to be disengaged from photovoltaic module 102. This will allow partial or complete removal of photovoltaic modules 102 from unitary frame 110. Furthermore, L bracket 144 is affixed to the ends of rails 104 within receiving slots 132. Specifically, L bracket 144 includes holes 158, which align with holes 136 on rails 104. A bolt or other fastener engages holes 158 and holes 136 to secure L bracket 144 to rails 104. The main deference between retaining brackets 140a and 140b is the orientation of L bracket 144, depending on which side of rail 104 it is positioned.

Additionally, during installation of unitized photovoltaic assembly 100 it may be helpful to disengage the retaining element 142 and slide photovoltaic modules 102 partially out of the unitary frame 110 in order to gain access to mounting brackets 152 or to additional elements of the system described above. As shown in FIGS. 3 and 5B, the surfaces of the U-shaped receiving slot 130 in each rail 104 are flat and smooth, as are surfaces of the edges of the photovoltaic module 102, thus enabling the photovoltaic modules 102 to slide relative to the unitary frame 110.

Figure 5A:
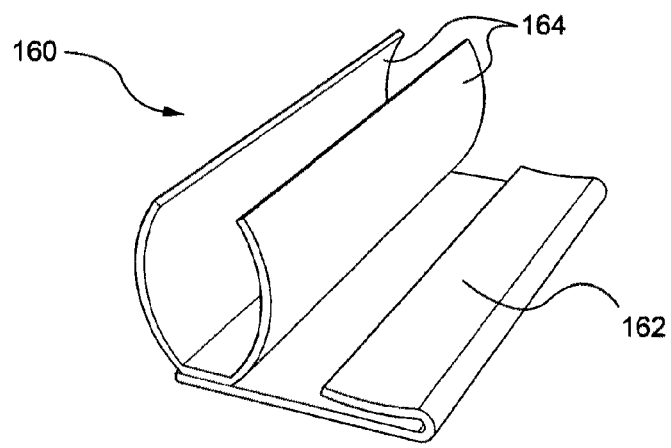
FIG. 5A is an isolated view of spacer 160 according to the present invention.
Figure 5B:
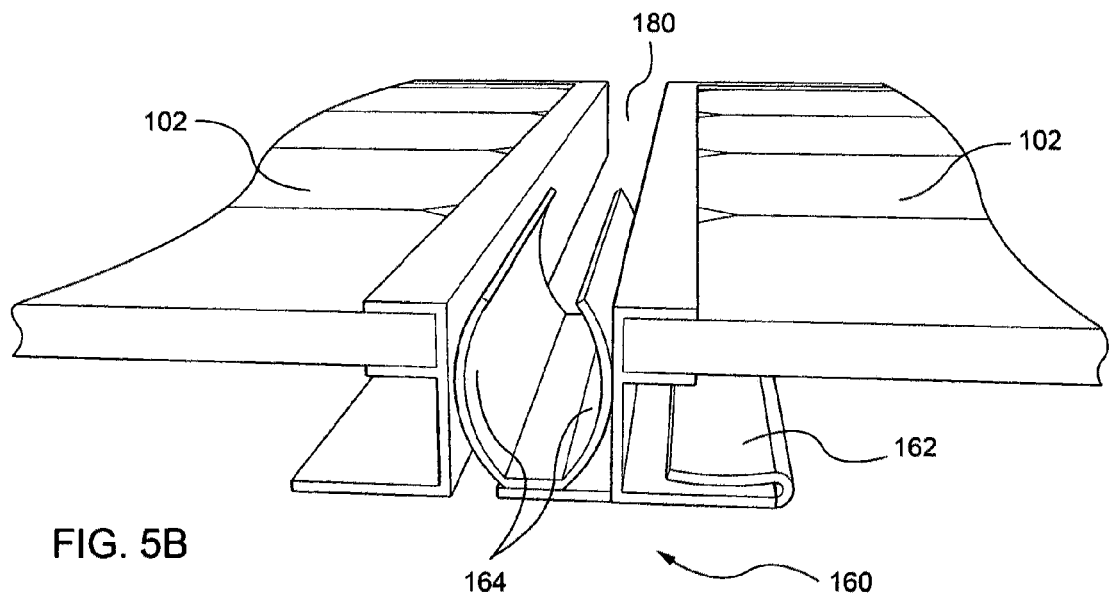
FIG. 5B is a cross-sectional view of spacer 160 according to the present invention.

FIGS. 5A and 5B show spacer 160. Spacer 160 comprises a clip 162, which attaches to photovoltaic modules 102. Spacer 160 includes fins 164. Fins 164 contact the edges of adjacent photovoltaic modules 102 thereby maintaining a gap 180. Gap 180 is useful for allowing the expansion and contraction of photovoltaic modules 102 during temperature changes. Spacer 160 is sufficiently resilient to allow such expansion and contraction of the photovoltaic modules 102. Additionally, gap 180 provides a space for lifting frame 190 to engage unitary frame 110, discussed below.

Figure 6:
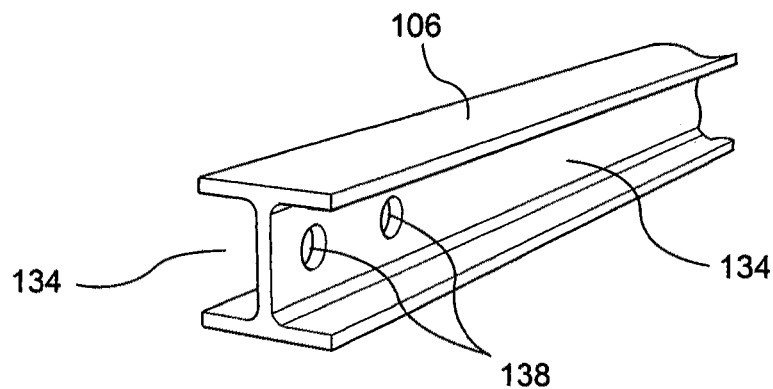
FIG. 6 is a perspective view of struts 106 according to the present invention.

FIG. 6 shows the uniform structural cross-section of struts 106, shown generally in FIG. 2. An extrusion process forms struts 106 with an "I" cross-section designed to resist flexure. Struts 106 are preferably made from aluminum alloy, but other material having similar strength to weight properties could also be used. The design of struts 106 provides U-shaped receiving slots 134 for accepting interlock elements 170. Struts 106 also provide mounting surfaces for additional elements attached to unitary frame 110, discussed above. In the present embodiment, struts 106 are oriented generally in the vertical direction to align with the roof's underlying rafters 154. It is important to note that struts 106 must not be aligned with gaps 180 as this will prevent lifting frame 190 from engaging with unitary frame 110.

Figure 7A:
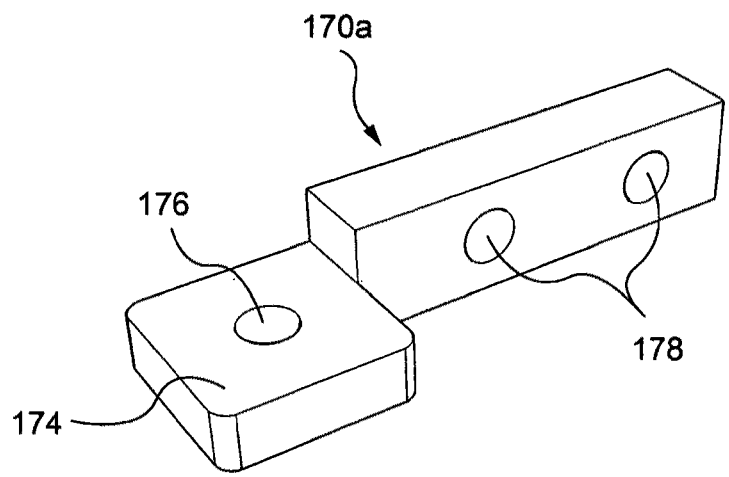
FIG. 7A is an isolated view of mounting interlock 170a according to the present invention.
Figure 7B:
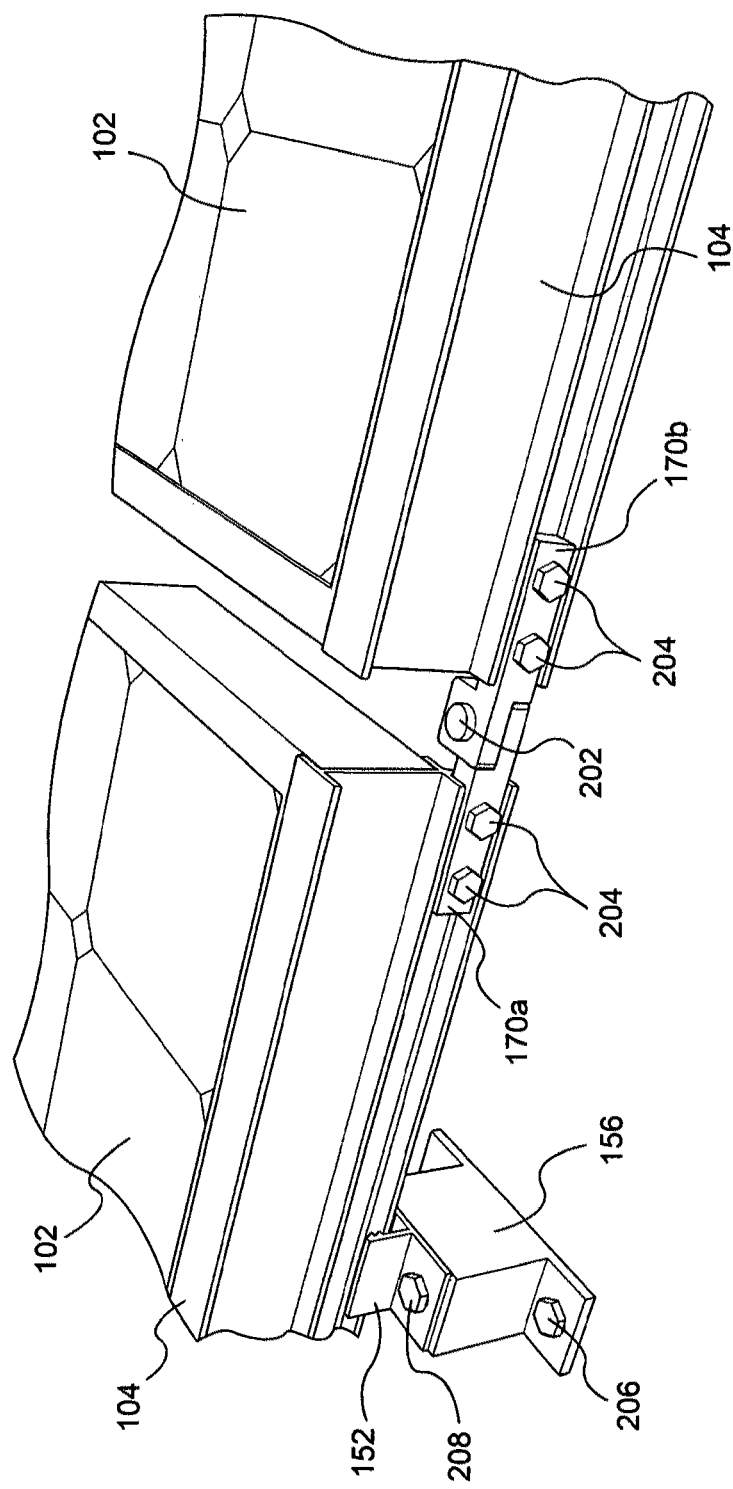
FIG. 7B is a perspective view of mounting interlocks 170a,b according to the present invention.

The preferred embodiment includes interlocks 170a,b, shown in FIGS. 7A and 7B, in order to maintain a mechanical relationship between adjacent unitized photovoltaic assemblies 100, thereby contributing to the structural integrity and load sharing capacity of the completed system. Interlocks 170a,b are attached to the ends of rails 104 and struts 106 within receiving slots 132 and 134, respectively. Mounting interlocks 170a,b include holes 178, which align with holes 136 or 138 depending on whether they are mounted to rails 104 or struts 106. As shown in FIG. 7A, interlocks 170 also provide a ledge 174. Ledge 174 is positioned face up or face down in order to engage a corresponding adjacent ledge 174. The interaction between adjacent interlocks 170a,b is more clearly demonstrated in FIG. 7B. Interlocks 170a,b also include a locking hole 176 to accept a fastener 202, thereby mechanically joining adjacent unitized photovoltaic assemblies 100. Mounting interlocks 170a and 170b are mirrored so that corresponding locking holes 176 will align during the joining of unitized photovoltaic assemblies 100.

Also shown in FIG. 7B, are mounting brackets 152 for securing unitized photovoltaic assembly 100 to a surface. Mounting brackets 152 are attached to rails 104 or struts 106 of the unitary frame 110. During installation, mounting brackets 152 are secured to standard mounting devices 156 using bolts 208. Prior to installation of the unitized photovoltaic assembly 100, mounting devices 156, are installed to the surface 150 and secured with lag bolts 206 to underlying rafters 154. FIG. 1 more broadly illustrates the use of mounting brackets 152 for securing unitary frame 110 to a surface 150. In some instances, mounting devices 156 may not be required, in which case mounting brackets 152 can be directly attached to surface 150 or underlying rafters 154, depending on the local building code.

Figure 9:
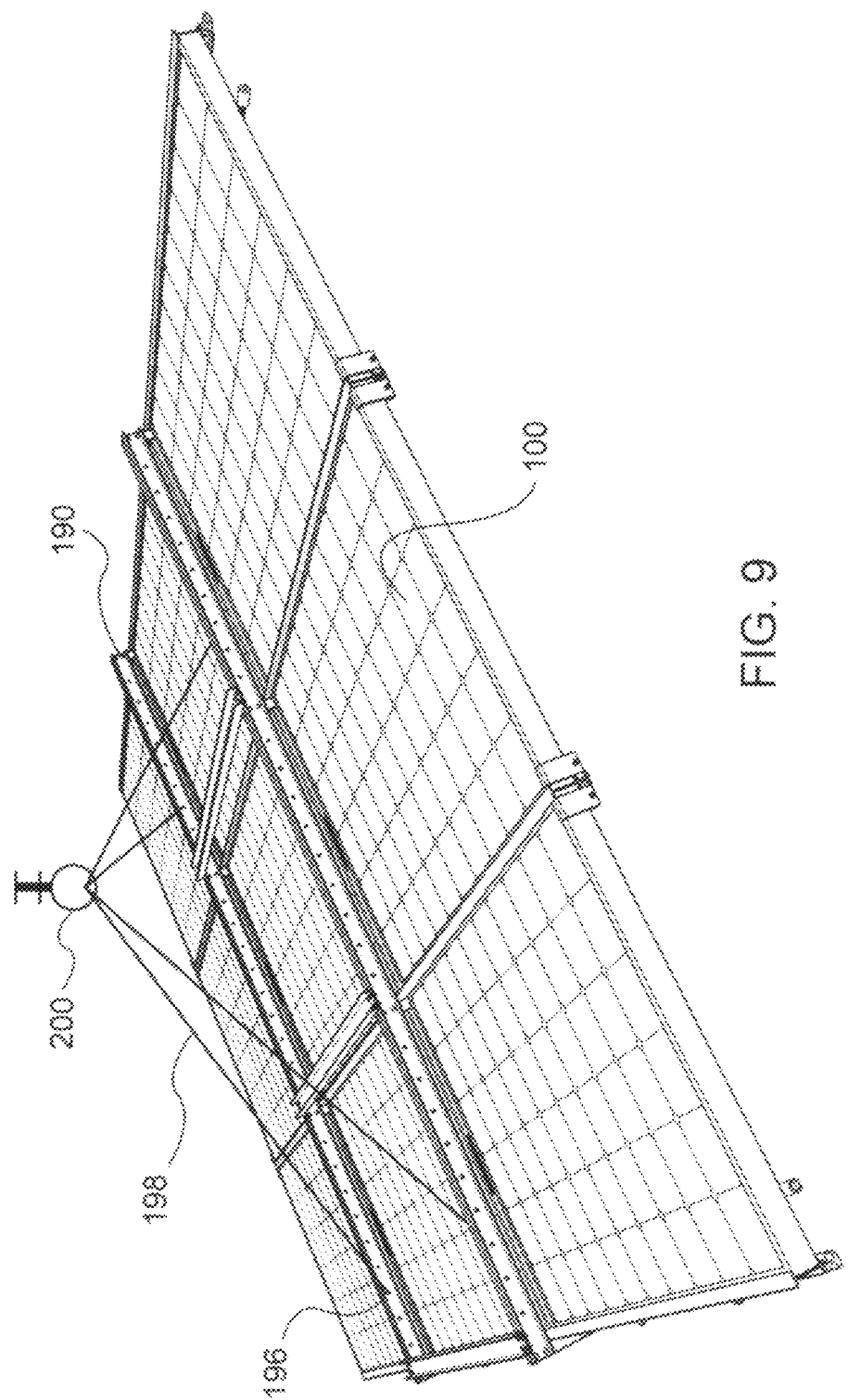
FIG. 9 is a perspective view of lifting frame 190 engaged with a unitized photovoltaic array 100 according to the present invention.
Figure 10:
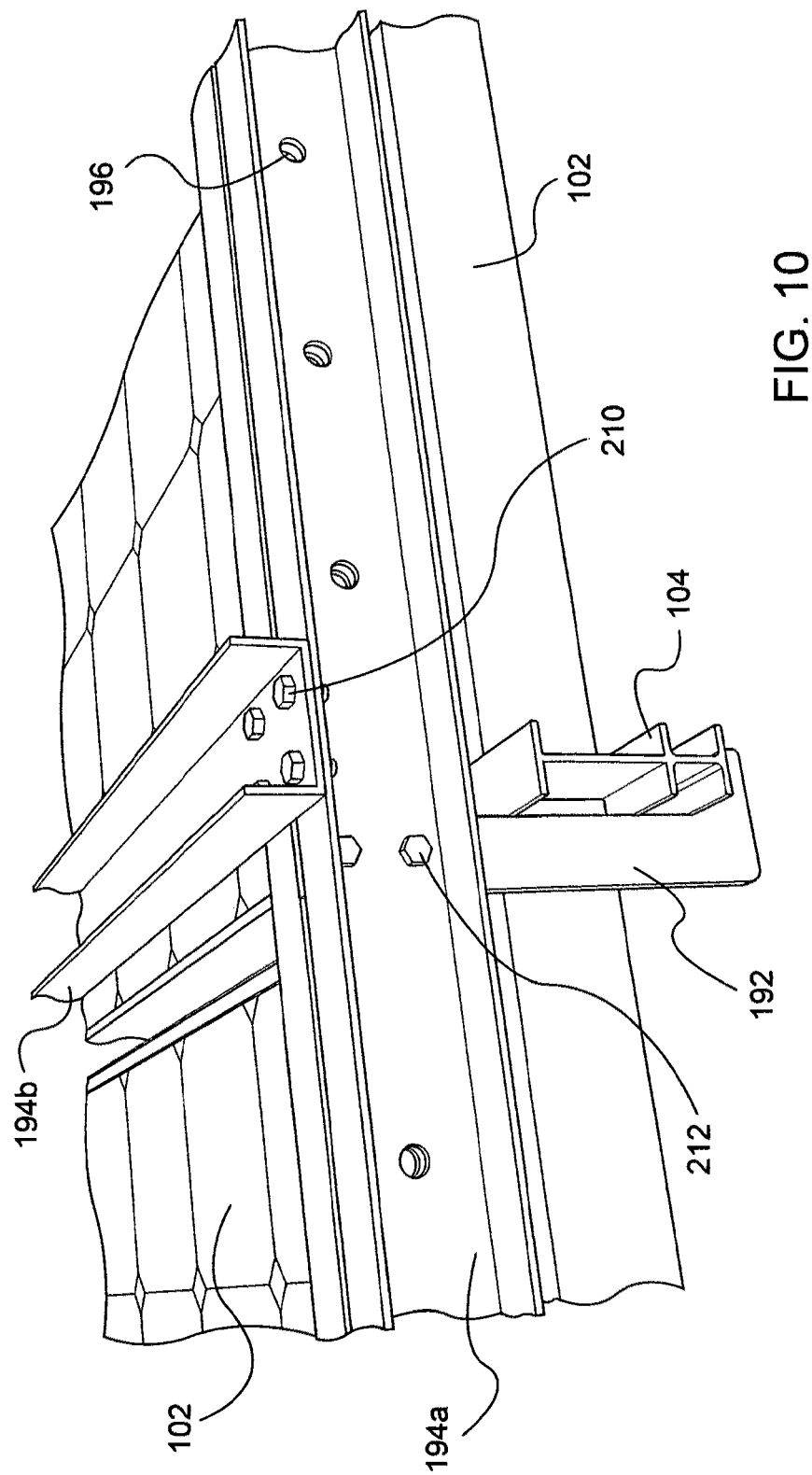
FIG. 10 is a cross-sectional view of lifting frame 190 engaged with a unitized photovoltaic array 100 according to the present invention.

FIGS. 8, 9 and 10 relate to the structure and use of lifting frame 190. Unitary frame 110 is designed to maintain the general structure of unitized photovoltaic assembly 100, but it is not significantly rigid to support photovoltaic modules 102 independently. Merging lifting frame 190 with unitized photovoltaic assembly 100 provides the necessary rigidity to inhibit bending of unitary frame 100 and thereby prevents damage to photovoltaic modules 102 during installation.

Lifting frame 190 comprises a framework having a plurality of tabs 192 and rail supports 194a, b for engaging unitary frame 110. More specifically, tabs 192 pass through gaps 180 to engage corresponding horizontal rails 104. Vertical rail supports 194a are comprised of two "C" channels oriented back to back with tabs 192 positioned between them. Tabs 192 are secured to rail supports 194a with bolts 212, as shown in FIG. 10. Horizontal cross rail supports 194b, also "C" channels, are attached to the horizontal rail supports 194a with bolts 210. Bolts 210 and 212 are used to allow for lifting frame 190 to be adjusted for unitized photovoltaic assemblies 100 of varying sizes. For large assemblies 100 additional rail supports 194a can be added including additional tabs 192.

In the preferred embodiment, lifting frame 190 is connected to a crane hook 200 by cables 198 attached to holes 196, as shown in FIG. 9. The cables 198 can be attached to different holes 196 and repositioned in relation to the crane hook 200 to achieve varying angles in order to match the slope of the installation surface 150. After unitized photovoltaic assembly 100 is installed on the roof or other surface 150, lifting frame 190 is disengaged from unitized photovoltaic assembly 100 and re-used.

Although the present invention has been described in accordance with the embodiments shown and contains many specifics, these descriptions should not be construed as limiting the spirit of the invention or scope of the appended claims.

What is claimed is:

1. A unitized photovoltaic assembly, the assembly comprising:
   a unitary framework comprised of first and second spaced apart, laterally-extending horizontal rails and a plurality of struts joined to the horizontal rails and extending in a direction transverse to the horizontal rails, each horizontal rail defining a laterally-extending receiving slot;
   a plurality of photovoltaic modules, each photovoltaic module comprising a photovoltaic member, each photovoltaic module having a first pair of opposing edges and a second pair of opposing edges, said first pair of opposing edges being retained within the receiving slots of said first and second horizontal rails so that the photovoltaic module spans a space between the first and second rails, the receiving slots having surfaces configured so that the first pair of opposing edges are slidable within the receiving slots;
   a retaining bracket fastened to one of said first and second horizontal rails and extending into the space between the first and second horizontal rails so as to retain the photovoltaic modules by blocking them from sliding laterally past the retaining bracket, the retaining bracket being adjacent one of the second pair of opposing edges of one of the plurality of photovoltaic modules; and
   a panel spacer interposed between adjacent first and second ones of the plurality of the photovoltaic modules so as to maintain a gap between the adjacent photovoltaic modules;
   wherein the panel spacer is attached to and supported by the first one of the plurality of the photovoltaic modules and is independent of the second one of the plurality of the photovoltaic modules.

2. The unitized photovoltaic assembly of claim 1, wherein said unitary framework comprises:
   a plurality of horizontal rails having a uniform double "I" cross-section;
   a plurality of vertical struts having a uniform "I" cross section;
   uniform rows and columns of said horizontal rails and vertical struts comprising said unitary framework;
   a plurality of welds for securing said horizontal rails and vertical struts comprising said unitary framework, the horizontal rails being welded to the vertical struts at the plurality of welds; and
   a plurality of mounting brackets.

3. The unitized voltaic assembly of claim 1, wherein said retaining bracket further comprises:
   a bracket affixed to said horizontal rail;
   a retaining surface abutting at least one edge of said second pair of opposing edges of at least one photovoltaic module; and
   a fastener securing said retaining surface to said bracket.

4. The unitized photovoltaic assembly of claim 3, wherein said retaining surface is removable.

5. The unitized photovoltaic assembly of claim 1, further comprising:
   at least one spray head;
   at least one connector connected to said spray head;
   a plurality of tubing attached to said connector; and
   at least one fluid interconnect attached to said tubing.

6. The unitized photovoltaic assembly of claim 1, wherein said panel spacers further comprises:
   a mounting portion configured to allow attachment of the spacers to said photovoltaic module; and
   a first fin abutting one edge of said second pair of opposing edges of a first photovoltaic module and a second fin abutting one edge of said second pair of opposing edges of a second photovoltaic module.

7. The unitized photovoltaic assembly of claim 1 in conjunction with a second unitized photovoltaic assembly, each unitized photovoltaic assembly further comprising a plurality of mounting interlocks fastened to said horizontal rails or said vertical struts and positioned such that at least one mounting interlock of the unitized photovoltaic assembly is coupled with the mounting interlock of the second unitized photovoltaic assembly.

8. The assembly of claim 7, wherein the unitized photovoltaic assembly and second unitized photovoltaic assembly each further comprise a plurality of power conversion elements fastened to the respective unitary framework and electrically connected to at least one corresponding photovoltaic module and a plurality of wiring, the assembly further comprising a plurality of polarized power connectors connected to said wiring and positioned such that at least one polarized power connector for the unitized photovoltaic assembly is aligned with at least one polarized power connector for the second unitized photovoltaic assembly when the photovoltaic assemblies are coupled together.

9. A unitized photovoltaic assembly, the assembly comprising:
   a unitary framework comprised of first and second spaced apart horizontal rails and a plurality of vertical struts joined to the horizontal rails, each horizontal rail defining a laterally-extending receiving slot;

a plurality of photovoltaic modules, each photovoltaic module comprising a photovoltaic member, each photovoltaic module having a first pair of opposing edges and a second pair of opposing edges, said first pair of opposing edges being retained within the receiving slots of said first and second horizontal rails so that the photovoltaic module spans a space between the first and second rails, the receiving slots having surfaces configured so that the first pair of opposing edges are slidable within the receiving slots;

a retaining bracket fastened to one of said first and second horizontal rails and extending into the space between the first and second horizontal rails so as to retain the photovoltaic modules by blocking them from sliding laterally past the retaining bracket, the retaining bracket being adjacent one of the second pair of opposing edges of one of the plurality of photovoltaic modules; and a lifting frame, said lifting frame comprising:

a framework; and a plurality of tabs extending from the lifting frame framework, the tabs configured to engage with said unitary framework at a plurality of spaced-apart tab contact points.

10. The unitized assembly of claim 9 additionally comprising a panel spacer interposed between adjacent ones of the plurality of the photovoltaic modules so as to maintain a gap between the adjacent photovoltaic modules.

11. The unitized assembly of claim 9, wherein the lifting frame is attachable to a crane hook, and the lifting frame is configured so that an angle of the framework relative to horizontal can be adjusted when the lifting frame is hanging from the crane hook.

12. A unitized photovoltaic assembly, comprising:

a plurality of photovoltaic modules, each photovoltaic module comprising a photovoltaic member, opposing first and second sliding edges and opposing first and second outer edges;

first and second laterally-directed rails, each rail having an extruded structure defining a U-shaped slot comprising upper and lower portions connected by a web portion, the slots each configured to slidably receive a sliding edge of one of the photovoltaic modules therein between the upper and lower portions;

a plurality of elongate struts attached to the first and second rails and extending in a direction transverse to the rails; and a retaining element;

wherein the first and second rails are spaced apart from one another, a first sliding edge of a first one of the photovoltaic modules is received in the first rail slot, and a second sliding edge of the first one of the photovoltaic modules is received in the second rail slot so that the first and second rails support the first one of the photovoltaic modules so that the first one of the photovoltaic modules is slidable in opposing first and second lateral directions that are parallel to a plane defined between the first and second rail slots; and wherein in a first configuration the retaining element extends transverse to and across the plane between the first and second rail slots so as to be adjacent the first outer edge of the first one of the photovoltaic modules so that when the first one of the photovoltaic modules slides in the first lateral direction the first outer edge engages the retaining element, and the retaining element laterally retains the first one of the photovoltaic modules by stopping it from sliding further in the first lateral direction.

13. The unitized photovoltaic assembly of claim 12, wherein the first and second rail slots define surfaces configured so that the first and second sliding edges slide over the surfaces.

14. The unitized photovoltaic assembly of claim 12, wherein each of the rails additionally comprises a mounting portion unitarily formed with the slot and positioned below the slot, and wherein the struts are joined to the rails at the mounting portions.

15. The unitized photovoltaic assembly of claim 14, wherein the rails and struts collectively define a unitized framework.

16. The unitized photovoltaic assembly of claim 12, wherein the photovoltaic module comprises a frame disposed about the photovoltaic member, the first and second sliding edges being defined on the frame.

17. The unitized photovoltaic assembly of claim 12, wherein a first sliding edge of a second one of the photovoltaic modules is received in the first rail slot, and a second sliding edge of the second one of the photovoltaic modules is received in the second rail slot so that the first and second rails support the second one of the photovoltaic modules and the second one of the photovoltaic modules is slidable in a lateral direction, a first outer edge of the second one of the photovoltaic modules facing the second outer edge of the first one of the photovoltaic modules.

18. The unitized photovoltaic assembly of claim 17 additionally comprising a gap between the second outer edge of the first one of the photovoltaic modules and the first outer edge of the second one of the photovoltaic modules.

19. The unitized photovoltaic assembly of claim 18, additionally comprising a resilient spacer at least partially disposed in the gap, the spacer being interposed between the first and second ones of the photovoltaic modules so as to maintain the gap between the first and second ones of the photovoltaic modules.

20. The unitized photovoltaic assembly of claim 18, wherein the gap is not aligned with any of the struts.

21. The unitized photovoltaic assembly of claim 17, wherein the first and second outer edges of the first and second ones of the photovoltaic modules are at the same elevation.

22. The unitized photovoltaic assembly of claim 12, wherein the first and second outer edges of the first one of the photovoltaic modules are at the same elevation.

23. The unitized photovoltaic assembly of claim 22, wherein the first rail is vertically higher than the second rail.

24. The unitized photovoltaic assembly of claim 12, wherein the retaining element is releasably attached to the first rail, the retaining element engaging the second outer edge of the first one of the photovoltaic modules to retain the module by blocking it from sliding.

25. The unitized photovoltaic assembly of claim 24 additionally comprising one or more secondary elements attached to one of the rails or struts vertically below the plurality of photovoltaic modules, wherein when the retaining element is detached one or more of the plurality of photovoltaic modules can be slid so as to provide access to the one or more secondary elements.

26. The unitized photovoltaic assembly of claim 25, wherein the one or more secondary elements comprise one or more of a power conversion element, a plurality of wiring, and roof mounts.

27. The unitized photovoltaic assembly of claim 12, wherein in a second configuration the retaining element is positioned so that it does not cross the plane between the first and second rail slots, and the first one of the photovoltaic modules is slidable in the first lateral direction without the first free end engaging the retaining element.

28. The unitized photovoltaic assembly of claim 27, wherein the retaining element is detachably connected to one of the first and second rails, and the retaining element is detached when in the second configuration.

29. A system comprising a unitized photovoltaic assembly in conjunction with a lifting frame, the unitized photovoltaic assembly comprising:

first and second photovoltaic modules, each photovoltaic module comprising a photovoltaic member, opposing first and second sliding edges and opposing first and second outer edges;

first and second laterally-directed rails, each rail having a slot, the slots each configured to slidably receive a sliding edge of one of the photovoltaic modules therein; and a plurality of elongate struts attached to the first and second rails and extending in a direction transverse to the rails;

the first and second rails being spaced apart from one another, the first sliding edges of the first and second photovoltaic modules being received in the first rail slot, and the second sliding edges of the first and second photovoltaic modules being received in the second rail slot so that the first and second rails support the first and second photovoltaic modules adjacent one another with a gap between the second outer edge of the first photovoltaic module and the first outer edge of the second photovoltaic module;

the lifting frame being formed separately from the unitized photovoltaic assembly, and comprising a rigid framework and a plurality of spaced apart lifting tabs, a first one of the lifting tabs sized and configured to fit through the gap and engage the first rail, a second one of the lifting tabs sized and configured to fit through the gap and engage the second rail.

30. The system of claim 29, wherein the lifting frame comprises a crane attachment configured to be attachable to a crane, and the first and second lifting tabs comprise hooks that engage the first and second rails, respectively, so that when the lifting frame is lifted, the first and second lifting tab hooks apply lifting forces to the unitized photovoltaic assembly at the spaced-apart first and second rails.

* * * * *